US006937132B2

(12) United States Patent
Kato et al.

(10) Patent No.: US 6,937,132 B2
(45) Date of Patent: Aug. 30, 2005

(54) HIGH-VOLTAGE VARIABLE RESISTOR

(75) Inventors: Shinji Kato, Osaka-fu (JP); Yukihiko Yoshida, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/846,555

(22) Filed: May 17, 2004

(65) Prior Publication Data

US 2004/0263313 A1 Dec. 30, 2004

(30) Foreign Application Priority Data

Jun. 30, 2003 (JP) ........................................ 2003-186965

(51) Int. Cl.[7] .................................................. H01C 0/32
(52) U.S. Cl. ........................ 338/162; 338/184; 338/128
(58) Field of Search ................................ 338/160, 128, 338/162, 184

(56) References Cited

U.S. PATENT DOCUMENTS

| 5,517,171 A | * | 5/1996 | Kotani et al. ............... 338/118 |
| 5,929,745 A | * | 7/1999 | Tsunezawa et al. .......... 338/160 |
| 6,140,908 A | * | 10/2000 | Choi ............................ 338/162 |
| 6,200,156 B1 | * | 3/2001 | Hiraki et al. ................ 439/395 |
| 6,462,642 B1 | * | 10/2002 | Shimasaki ................... 338/162 |
| 6,677,849 B1 | * | 1/2004 | Kato et al. .................... 338/162 |

FOREIGN PATENT DOCUMENTS

JP     2000-200708     7/2000

* cited by examiner

Primary Examiner—Karl D. Easthom
(74) Attorney, Agent, or Firm—Keating & Bennett, LLP

(57) ABSTRACT

A high-voltage variable resistor includes an insulating-resin front case, and an insulating-resin rear case fitted to the front case. The front case further includes a circuit board having a circuit pattern including a resistive element, and a slider that is slidable on the resistive element. The rear case includes a capacitor housing for accommodating a capacitor, and a terminal guide for accommodating an external connection terminal. The capacitor housing and the terminal guides are integrally molded with the rear case.

16 Claims, 10 Drawing Sheets

HIGH-VOLTAGE VARIABLE RESISTOR

BACKGROUND OF THE INVENTION

1. Field of the Invention

The present invention relates to high-voltage variable resistors and particularly to a high-voltage variable resistor for adjusting focus voltage, screen voltage, and other voltages in, for example, a television receiver or other electronic apparatus.

2. Description of the Related Art

High-voltage variable resistors are generally used for adjusting focus voltages and screen voltages in television receivers. An example of known high-voltage variable resistors of this type is illustrated in FIGS. 6 to 9 (see also Japanese Unexamined Patent Application Publication No. 2000-200708). FIG. 6 is a front view of a high-voltage variable resistor, FIG. 7 is a bottom view of the high-voltage variable resistor, and FIG. 8 is a bottom view of the high-voltage variable resistor before being filled with insulating resin. FIGS. 9A and 9B are a side view and a bottom view, respectively, of a molded unit disposed on the rear surface of a circuit board.

This known high-voltage variable resistor 50 includes a case 51 made of insulating resin such as polybutylene terephthalate (PBT), a circuit board 52 disposed in the case 51, and a molded unit 53.

The case 51 has an opening at one end through which the circuit board 52 is mounted. A plurality of sliders (not shown, 6 sliders in this example) for adjusting resistance are disposed between the inner surface of the case 51 and the circuit board 52. Further, control shafts 54 for controlling the sliders extend through the upper portion of the case 51. The front surface of the circuit board 52 is provided with a circuit pattern (not shown) including resistive elements that are in contact with contacts of the sliders, and a plurality of electrodes electrically connected to external connection terminals 55 described below.

The molded unit 53 is made of insulating resin such as polyphenylene oxide (PPO) and PBT that are relatively inexpensive and have good moldability. The molded unit 53, parts of which are integrally molded, includes a capacitor housing 53a for accommodating a plurality of capacitors 56 (3 capacitors in this example), cylindrical terminal guides 53b for accommodating a plurality of external connection terminals 55 (9 connectors in this example), and connectors 53c for connecting the capacitor housing 53a and the terminal guides 53b. The capacitor housing 53a has resin inlets 53d. In the molded unit 53, the connectors 53c and each of the end portions of the capacitor housing 53a and the terminal guides 53b, the end portions being adjacent to the circuit board 52, are buried in the epoxy insulating resin 57, and thereby integrated with the case 51 together with the circuit board 52. The insulating resin 57 is poured over the entire rear surface of the circuit board 52 and cured.

In each external connection terminal 55, the lower end protrudes downward from each terminal guide 53b, while the upper end extends via a through hole of the circuit board 52 to a predetermined electrode in the circuit pattern on the front surface of the circuit board 52 and is soldered.

FIG. 10 is a circuit diagram of this known high-voltage variable resistor. In the drawing, VR1 to VR3 denote resistive elements for adjusting focus voltages, and VR4 to VR6 denote resistive elements for adjusting screen voltages. Further, IN1 denotes an input terminal for direct-current focus-voltage signals, IN2 denotes an input terminal for alternating-current parabolic-voltage signals for focus correction, OUT1 to OUT3 denote output terminals for focus-adjusting signals on which the parabolic voltage signals are superimposed, OUT4 to OUT6 denote output terminals for screen-adjusting signals, and GND denotes a ground terminal. Each of capacitors C1 to C3 serves as a coupling capacitor for superimposing the parabolic voltage signals on the focus voltage signals. For ease of understanding, the terminals shown in FIG. 10 and their electrically corresponding external connection terminals 55 shown in FIG. 7 are given the same reference numerals.

To assemble the high-voltage variable resistor 50, first the capacitors 56 are placed in the capacitor housing 53a of the molded unit 53, the external connection terminals 55 are inserted into the respective terminal guides 53b, and then lead terminals 56a for each capacitor 56 are connected to the respective predetermined external connection terminals 55.

Next, the molded unit 53 is attached to the circuit board 52 from the opening side of the case 51. The upper ends of the external connection terminals 55 are inserted into the through holes of the circuit board 52 to reach the electrodes on the upper surface, and are soldered.

Subsequently, the circuit board 52 is inserted from the opening of the case 51. The insulating resin 57 is then poured over the entire rear surface of the circuit board 52 and cured so that the molded unit 53 is secured to the case 51 together with the circuit board 52. Further, insulating resin is poured from the resin inlets 53d into the capacitor housing 53a and cured.

The known high-voltage variable resistor illustrated in FIGS. 6 to 9 has the following problems.

In a thermal shock test for assuring product quality, high-voltage variable resistors of this type are rapidly heated and cooled according to a predetermined heat cycle.

In the known high-voltage variable resistor, the entire rear surface of the circuit board 52 is filled with the insulating resin 57 to secure the molded unit 53 to the case 51. Since the material used to form the case 51 is different from the insulating resin 57, their coefficients of linear expansion are different. This causes an increase in thermal shock when the entire high-voltage variable resistor 50 is heated and cooled in the above-described test. As a result, the filled insulating resin 57 is peeled off the case 51, and the case 51 or the insulating resin 57 is cracked.

Moreover, pouring of insulating resin from the resin inlets 53d into the capacitor housing 53a is required in addition to pouring over the entire rear surface of the circuit board 52 to secure the molded unit 53 to the case 51. This causes an increase in usage of the insulating resin 57, man-hours, and costs.

SUMMARY OF THE INVENTION

In order to solve the problems described above, preferred embodiments of the present invention provide a high-voltage variable resistor that produces no resin cracks in thermal shocks, requires less usage of insulating resin and fewer man-hours, and thus can achieve significant cost reduction.

According to a first preferred embodiment of the present invention, a high-voltage variable resistor includes an insulating-resin front case, and an insulating-resin rear case fitted to the front case. The front case further includes a circuit board having a circuit pattern including a resistive element, and a slider that is slidable on the resistive element. The rear case includes a capacitor housing for accommodating a capacitor, and a terminal guide for accommodating an external connection terminal. The capacitor housing and the terminal guides are integrally molded with the rear case.

Here, the rear case is fitted into the front case, with the capacitor and the external connection terminal contained in the capacitor housing and the terminal guide, respectively. Therefore, insulating resin is not required to be poured over the entire rear surface of the circuit board for retaining the capacitor housing and the terminal guide. The application of a thermal shock, for example, in a thermal shock test does not cause resin cracks, and thus, high product quality is achieved. Cost reduction can also be achieved since less usage of insulating resin and fewer man-hours are required in production.

According to a second preferred embodiment of the present invention, the high-voltage variable resistor of the first preferred embodiment of the present invention further includes a contact electrode on the rear surface of the circuit board, the contact electrode being electrically connected to the circuit pattern. The contact electrode is electrically connected via conductive rubber pieces to the external connection terminal in the terminal guide.

Electrical connection between the external connection terminal and the circuit board can thus be established, with the circuit board resiliently supported between the front case and the rear case. Ease of assembly is also an advantage.

According to a third preferred embodiment of the present invention, in the high-voltage variable resistor of the first or second preferred embodiments of the present invention, the capacitor housing houses the capacitor provided with lead terminals, and the capacitor housing may be sealed with resin.

Since the capacitor is thus secured in the capacitor housing, the distance between the lead terminals is kept constant and the withstand voltage increases. Further, the amount of insulating resin required is not significant since it needs to be poured only in the capacitor housing. Moreover, the application of a thermal shock does not cause problems such as resin cracks.

According to a fourth preferred embodiment of the present invention, the high-voltage variable resistor of the third preferred embodiment of the present invention further includes an insulating-resin partition wall provided in the capacitor housing for electrically isolating the lead terminals of the capacitors.

The withstand voltage between the lead terminals thus increases and stable product quality is assured even when the rated voltage in operation is high.

According to a fifth preferred embodiment of the present invention, in the high-voltage variable resistor of the fourth preferred embodiment of the present invention, the partition wall is a plate disposed on a grooved holder provided in the capacitor housing, and the upper portion of the partition wall protrudes above the lead terminals and toward the rear surface of the circuit board.

Since the partition wall is disposed between the capacitor housing and the circuit board, the withstand voltage between the lead terminals can be increased without specifically raising the overall height of the product.

According to a sixth preferred embodiment of the present invention, in the high-voltage variable resistor of the fourth or fifth preferred embodiment of the present invention, the partition wall is formed by being integrally molded with the rear case and by being separated from the rear case.

Since integral molding requires only one mold instead of requiring different molds for the rear case and the partition wall, the costs required for mold production are reduced.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Figure 1:
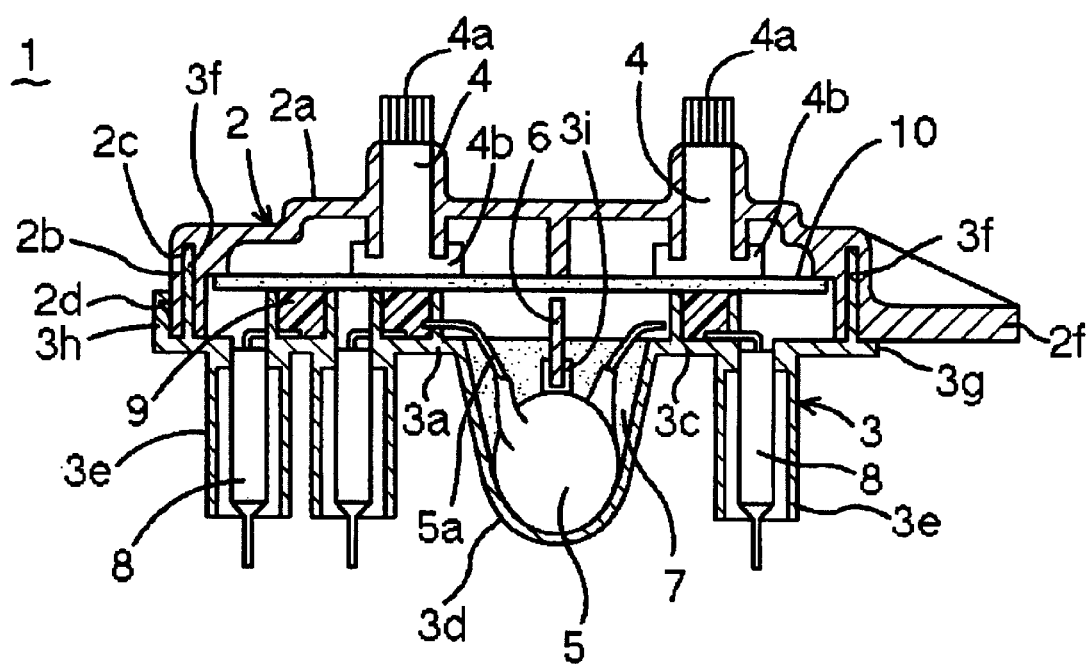
FIG. 1 is a vertical cross-sectional view of a high-voltage variable resistor according to a preferred embodiment of the present invention.
Figure 2:
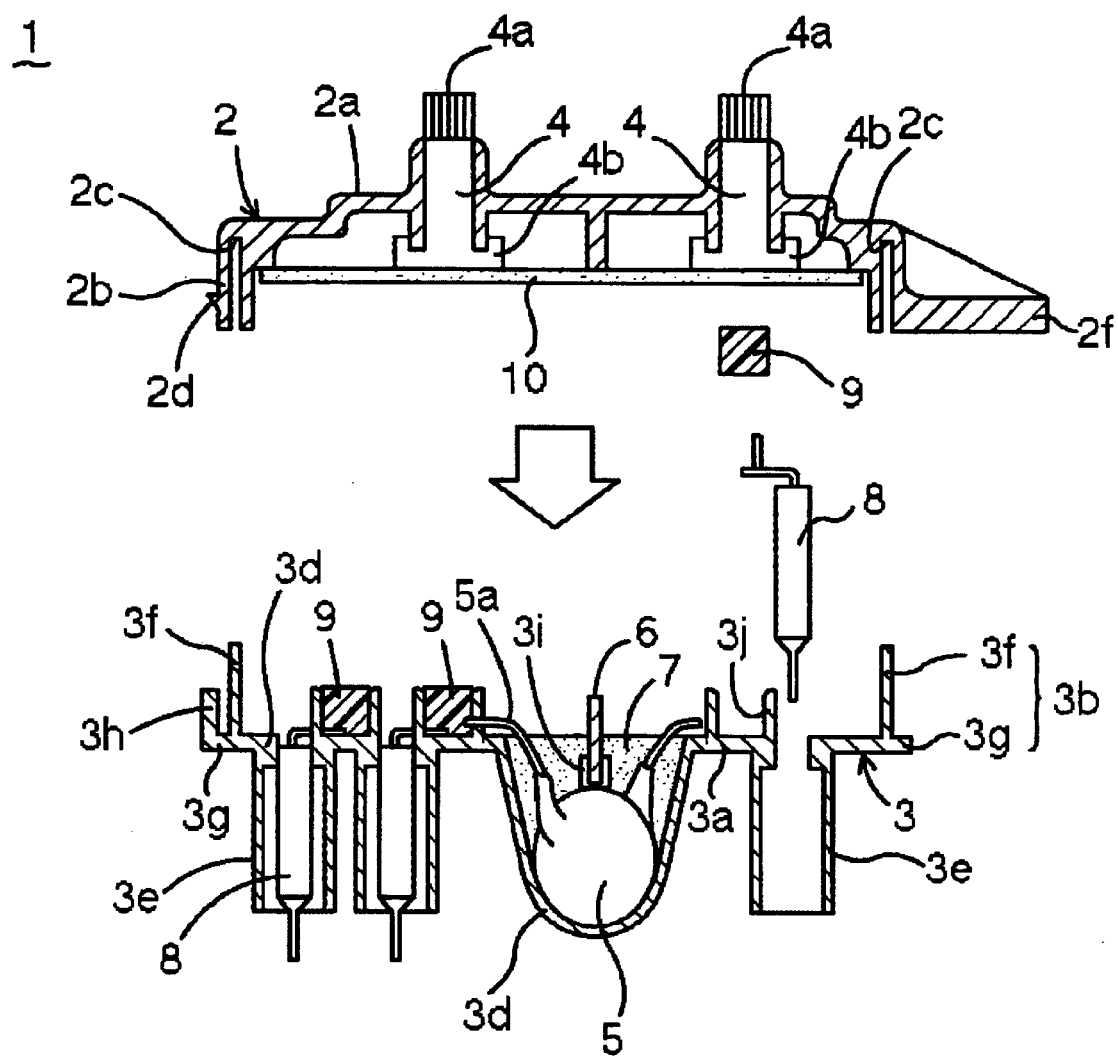
FIG. 2 is an exploded vertical cross-sectional view of the high-voltage variable resistor.

A high-voltage variable resistor 1 of a preferred embodiment of the present invention preferably includes a front case 2 and a rear case 3 fitted to the front case 2.

The front case 2 is preferably made of insulating resin such as PBT and has a ceiling 2a and a peripheral wall 2b that are integrally molded. The lower end of the peripheral wall 2b is open. The peripheral wall 2b has a fitting concave 2c open downward for engagement with a frame 3f of the rear case 3. Wedge-shaped engaging protrusions 2d are provided on the outer surface of each side of the peripheral wall 2b. Further, a bracket 2f having screw holes 2e for securing the high-voltage variable resistor 1 to a system such as a television receiver is provided on an outer surface of the peripheral wall 2b. The front case 2 has a circuit board 10 described below and a plurality of sliders 4 (for example, 6 sliders in this preferred embodiment) for varying resistance. Control shafts 4a for the respective sliders 4 extend through the ceiling 2a and protrude upward.

Similarly to the front case 2, the rear case 3 is preferably made of insulating resin such as PBT and has a bottom 3a and a peripheral wall 3b that are integrally molded. The upper end of the peripheral wall 3b is open. The bottom 3a has a tabular flat area 3c on which half cylindrical rubber holders 3j for accommodating conductive rubber pieces 9 protrude upward. Further, a capacitor housing 3d and cylindrical terminal guides 3e are integrally molded downward from the flat area 3c. The peripheral wall 3b includes the frame 3f fitted to the fitting concave 2c of the front case 2, and a rib 3g overhanging outwardly from the lower end of the frame 3f. Inverted U-shaped window frames 3h, each being engaged with the engaging protrusions 2d of the front case 2, are provided on predetermined positions of the outer surface of each side of the rib 3g.

In the capacitor housing 3d, a plurality of capacitors 5 (for example, 3 capacitors in this preferred embodiment) are disposed and a partition wall 6 is provided. The partition wall 6 is preferably made of plate insulating-resin and electrically isolates lead terminals 5a of each capacitor 5. The partition wall 6 is fitted in a grooved holder 3i in the capacitor housing 3d. In the rear case 3, the upper portion of the partition wall 6 protrudes above the lead terminals 5a toward the rear surface of the circuit board 10. The capacitor housing 3d is filled with epoxy insulating resin 7.

External connection terminals 8 are disposed in respective terminal guides 3e. In each external connection terminal 8, the lower end protrudes downward from the rear case 3, while the upper end sticks in the short-cylindrical conductive rubber 9 held in the rubber holder 3j to establish an electrical connection.

Figure 4:
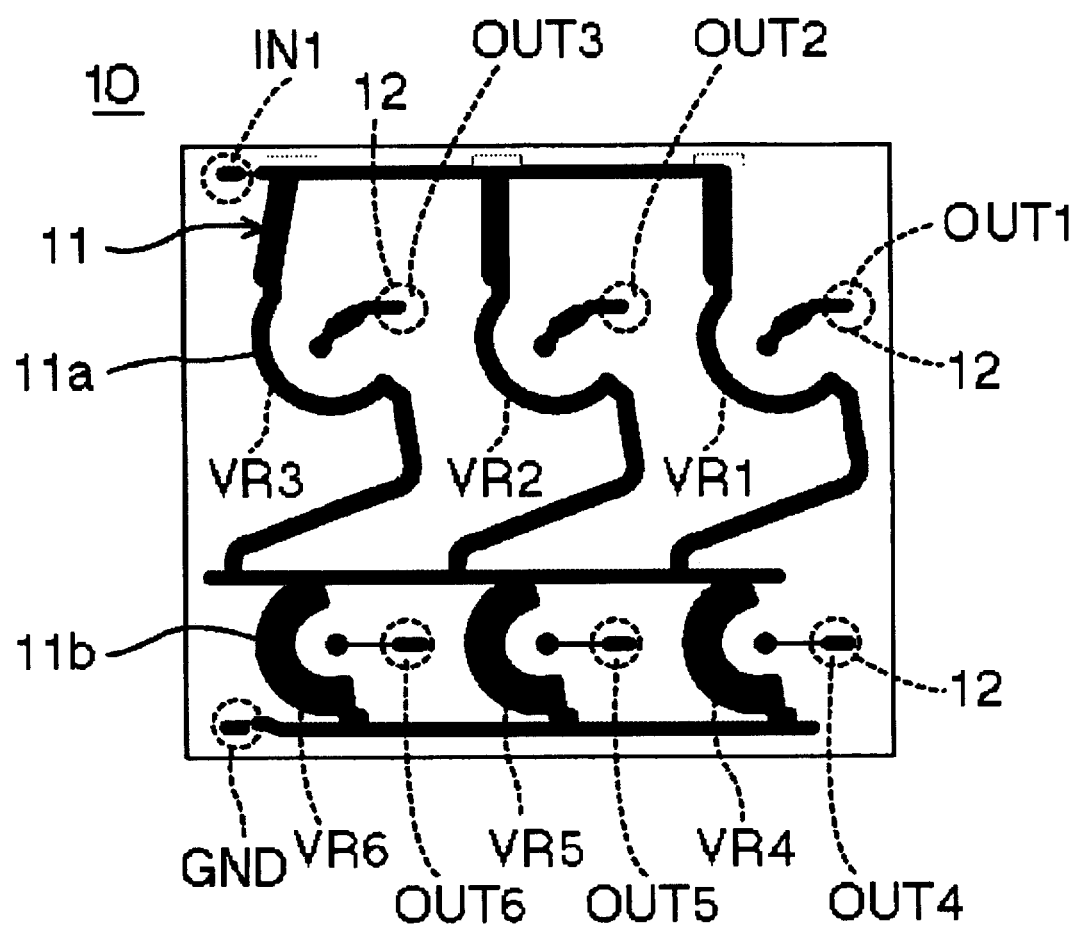
FIG. 4 is a plan view showing the front surface of a circuit board in the high-voltage variable resistor.

The circuit board 10 is made of, for example, alumina ceramic and has a circuit pattern 11 on the upper surface as shown in FIG. 4. This circuit pattern 11 includes resistive elements 11a for adjusting focus voltages and resistive elements 11b for adjusting screen voltages, and both the resistive elements 11a and 11b are in contact with contacts 4b of the sliders 4. Further, contact electrodes 12 are provided on the rear surface of the circuit board 10, each contact electrode 12 being connected via a through hole (not shown) to the circuit pattern 11, while being electrically connected via the corresponding conductive rubber 9 to the corresponding external connection terminal 8.

Figure 3:
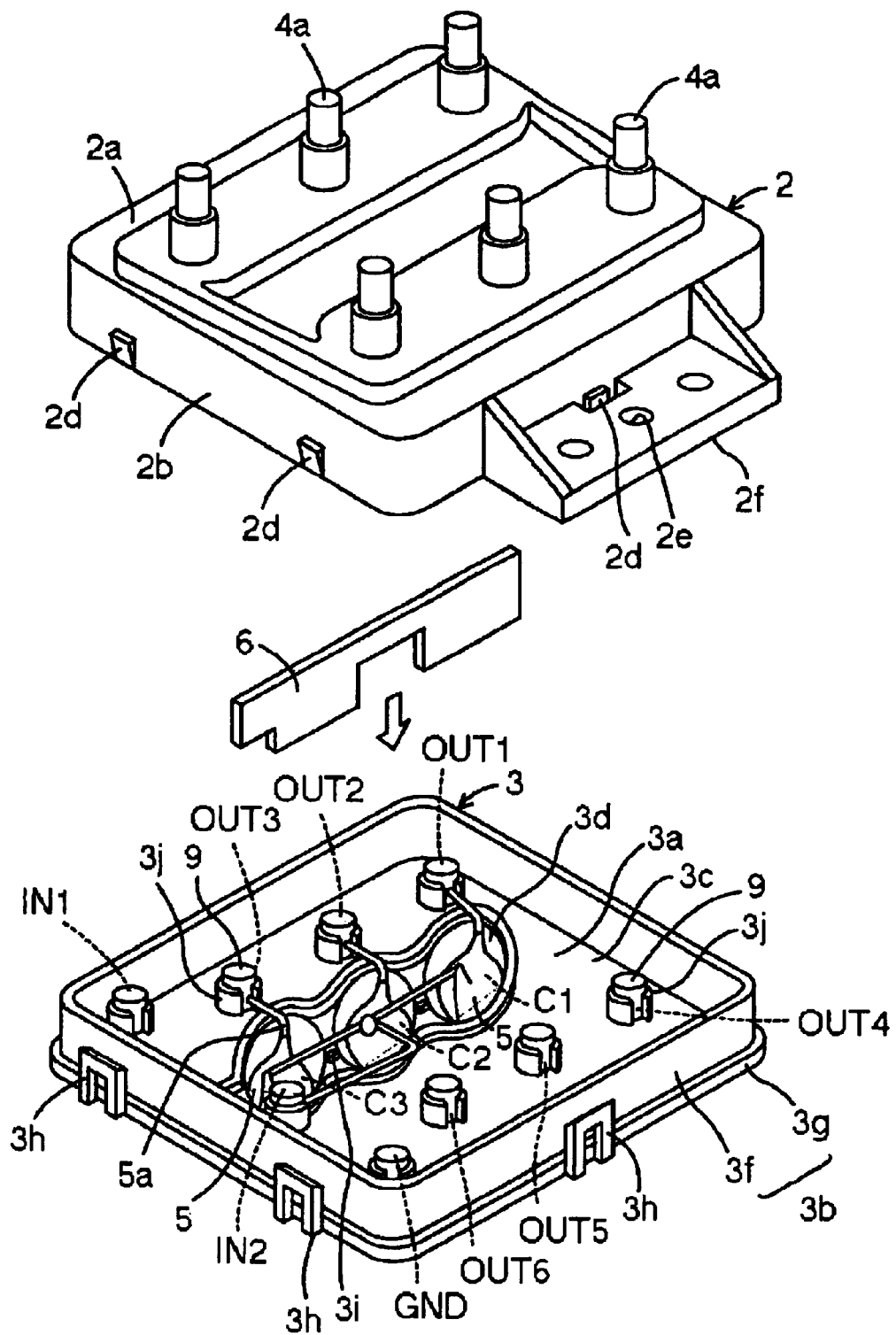
FIG. 3 is an exploded perspective view of the high-voltage variable resistor with a capacitor housing before being filled with insulating resin.
Figure 10:
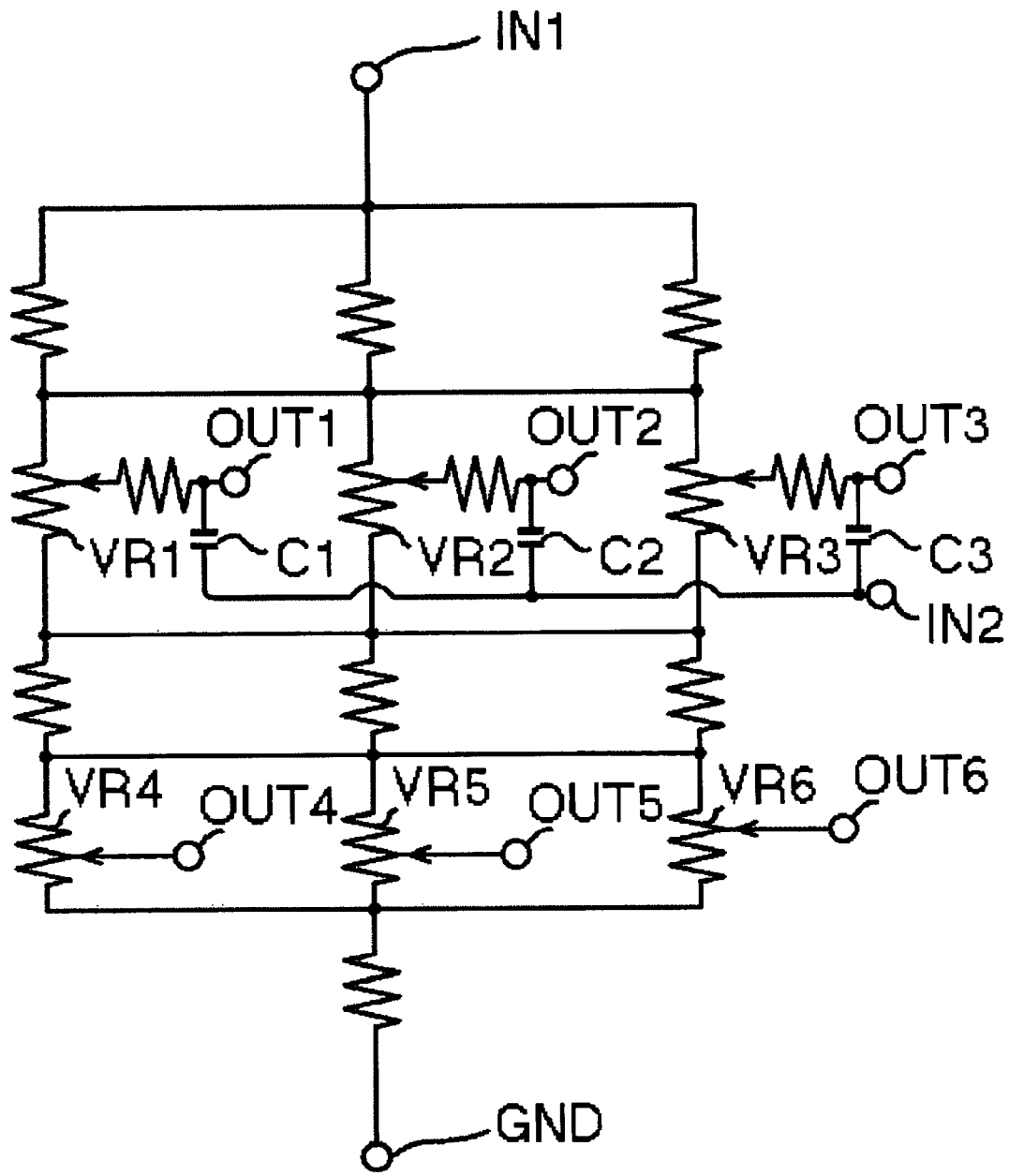
FIG. 10 is a circuit diagram of the known high-voltage variable resistor.

Thus the high-voltage variable resistor of the present preferred embodiment has basically the same circuitry as that of the known example shown in FIG. 10. For ease of understanding, components shown in FIG. 10 and their electrically corresponding components in FIGS. 3 and 4 are given the same reference numerals.

To assemble the described high-voltage variable resistor 1, the capacitors 5 are first placed in the capacitor housing 3d of the rear case 3, and a plate is inserted into the grooved holder 3i in the capacitor housing 3d to form the partition wall 6. Then, the insulating resin 7 is poured into the capacitor housing 3d and cured. Thus, the amount of the insulating resin 7 required for securing the capacitors 5 is not significant since it needs to be poured only in the capacitor housing 3d of the rear case 3.

Subsequently, each external connection terminal 8 is inserted into the corresponding terminal guide 3e, while each conductive rubber 9 is inserted into the corresponding rubber holder 3j. Then the lead terminals 5a of each capacitor 5 are connected via the conductive rubber pieces 9 to the respective predetermined external connection terminals 8. In particular, the lead terminals 5a of one side of capacitors C1 to C3 are connected to a common input terminal IN2 for parabolic voltage signals, while the other lead terminals 5a are connected to the respective output terminals OUT1 to OUT3 for focus voltage adjusting signals.

Then, after placing the circuit board 10 on the rear case 3, the front case 2 is fitted into the rear case 3. That is, the frame 3f of the rear case 3 is inserted into the fitting concave 2c of the front case 2, while each engaging protrusion 2d is moved into engagement with the corresponding window frame 3h to integrate the front case 2 and the rear case 3.

Each of all the conductive rubber pieces 9 except the one being electrically connected to the external connection terminal 8 functioning as the input terminal IN2 comes into contact with the corresponding contact electrode 12 on the rear surface of the circuit board 10. Therefore, each external connection terminal 8 is electrically connected via the corresponding conductive rubber 9 and contact electrode 12 to the circuit pattern 11 on the upper surface of the circuit board 10.

In the high-voltage variable resistor 1 of the present preferred embodiment, the rear case 3 is fitted into the front case 2, with the capacitors 5 and the external connection terminals 8 contained in the capacitor housing 3d and the terminal guides 3e, respectively. Therefore, it is not necessary to pour the insulating resin 7 over the entire rear surface of the circuit board 10 for securing the capacitors 5 and the external connection terminals 8. The application of a thermal shock, for example, in a thermal shock test does not cause problems such as resin cracks, and a high product quality can thus be achieved.

Moreover, the partition wall 6 protruding above the lead terminals 5a of the capacitors 5 is disposed between the capacitor housing 3d and the circuit board 10. Therefore, even if a high voltage is applied between the lead terminals 5a of the capacitors 5, short circuits caused by discharge can be effectively prevented. Further, since the capacitor housing 3d is filled with the insulating resin 7, the capacitors 5 are secured to the rear case 3 and the distance between the lead terminals 5a is kept constant. The withstand voltage between the lead terminals 5a thus increases and stable product quality is assured even when the rated voltage in operation is high.

Furthermore, use of the conductive rubber pieces 9 for establishing electrical connections between the external connection terminals 8 and the circuit board 10 allows the circuit board 10 to be resiliently supported between the front case 2 and the rear case 3. Ease of assembly compared to soldering and others is also an advantage.

The following describes applications and modifications to the above-described preferred embodiment.

In the described preferred embodiment, the partition wall 6 is preferably provided in the capacitor housing 3d of the rear case 3. At a low rated voltage, however, the capacitor housing 3d may be filled with the insulating resin 7 without providing the partition wall 6. At a lower rated voltage, even pouring of the insulating resin 7 into the capacitor housing 3d may be omitted.

Figure 5:
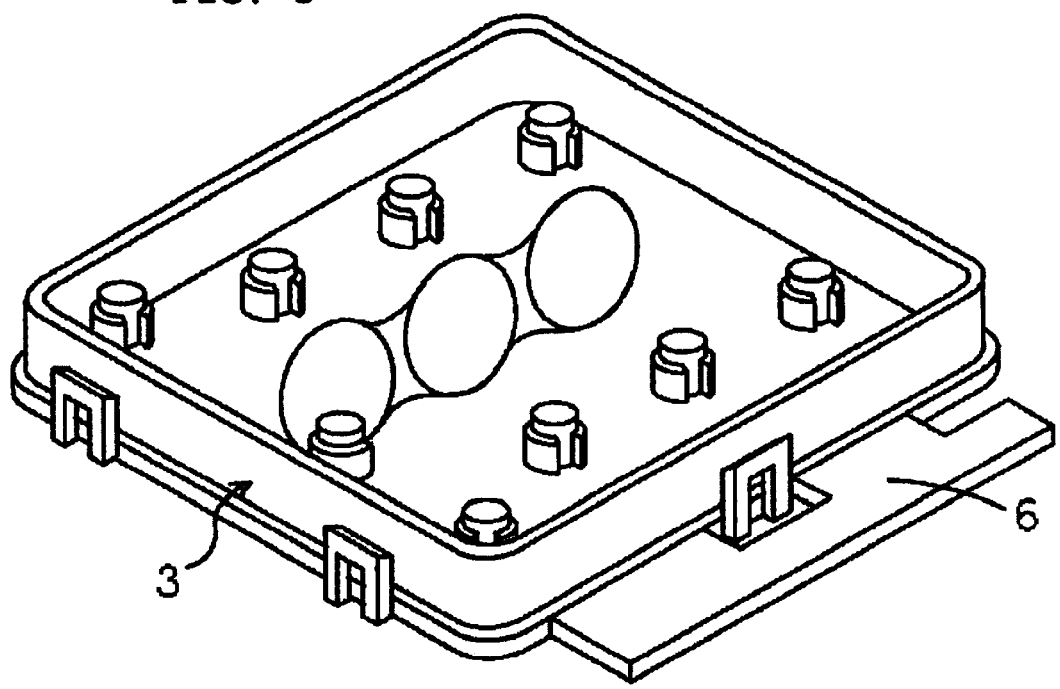
FIG. 5 is a perspective view showing a rear case and a partition wall integrally molded in one mold.
Figure 6:
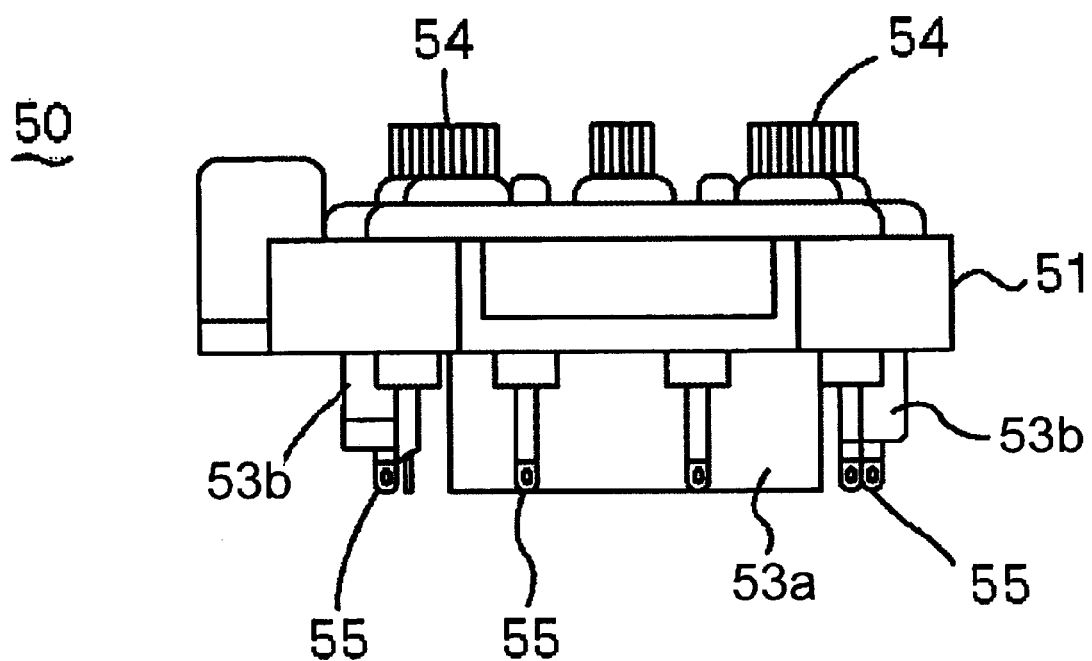
FIG. 6 is a front view of a known high-voltage variable resistor.
Figure 7:
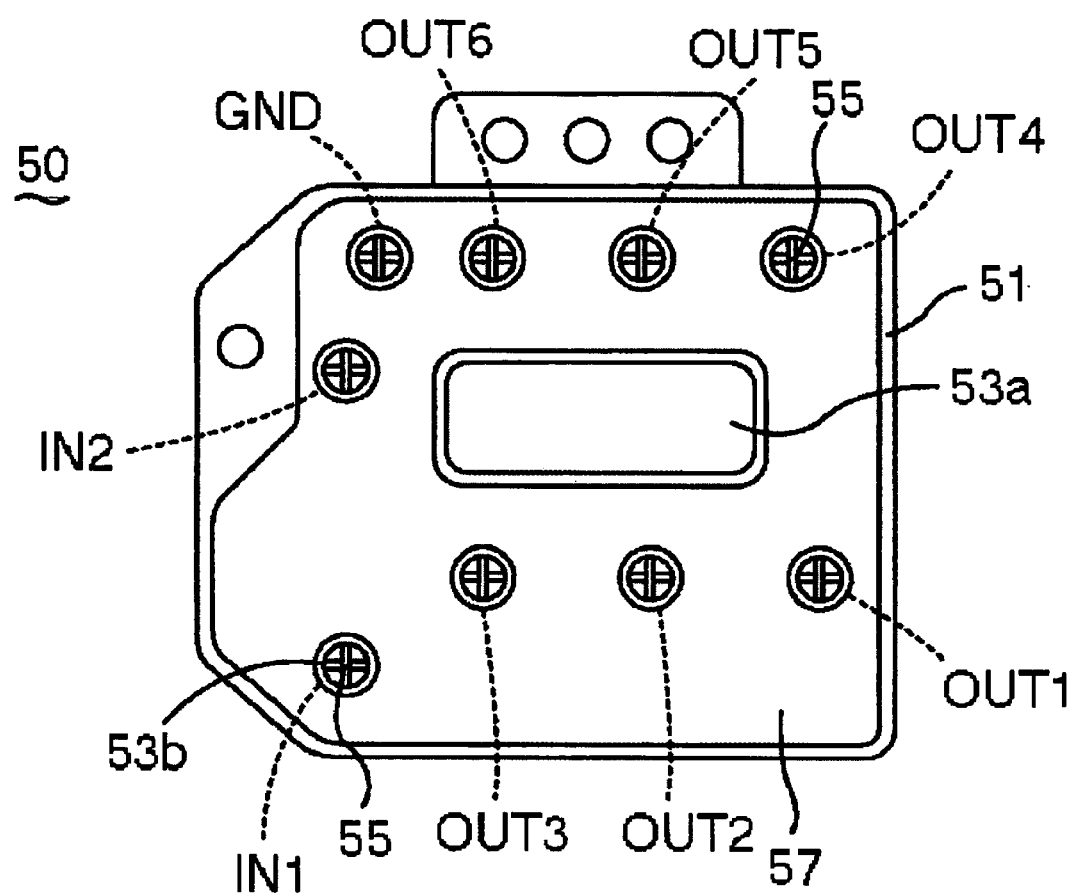
FIG. 7 is a bottom view of the known high-voltage variable resistor.
Figure 8:
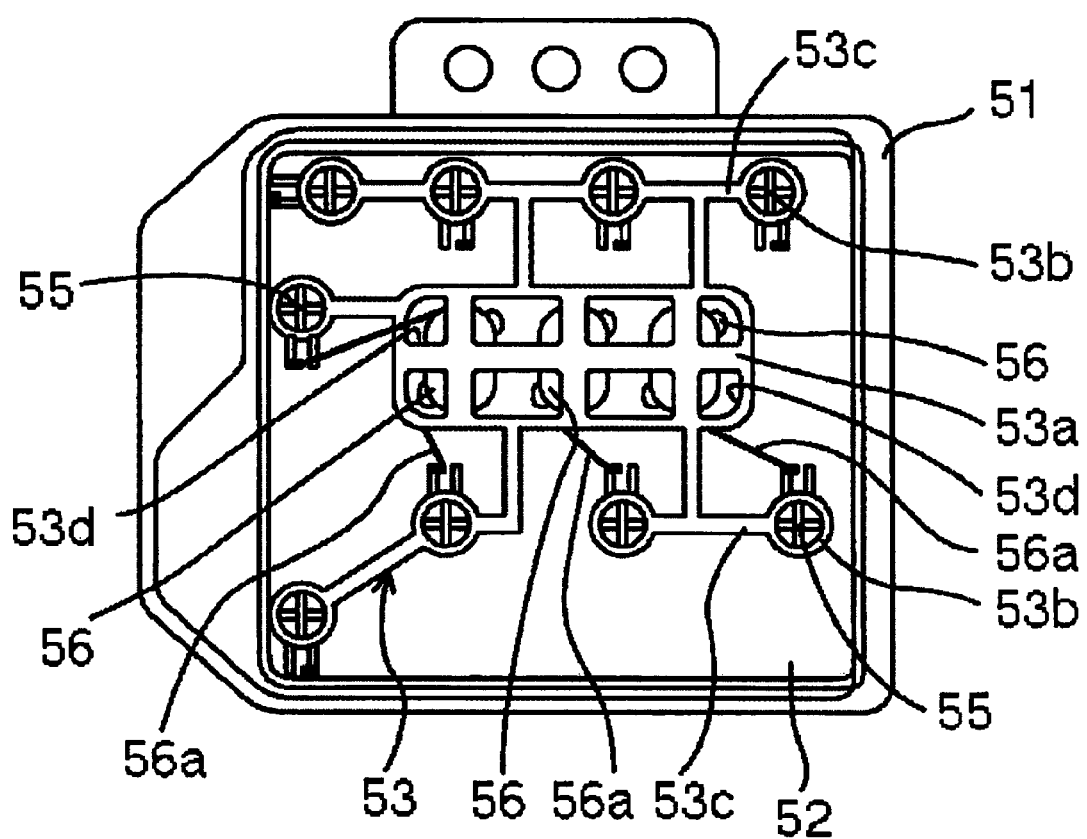
FIG. 8 is a bottom view of the known high-voltage variable resistor before being filled with insulating resin.
Figure 9A:
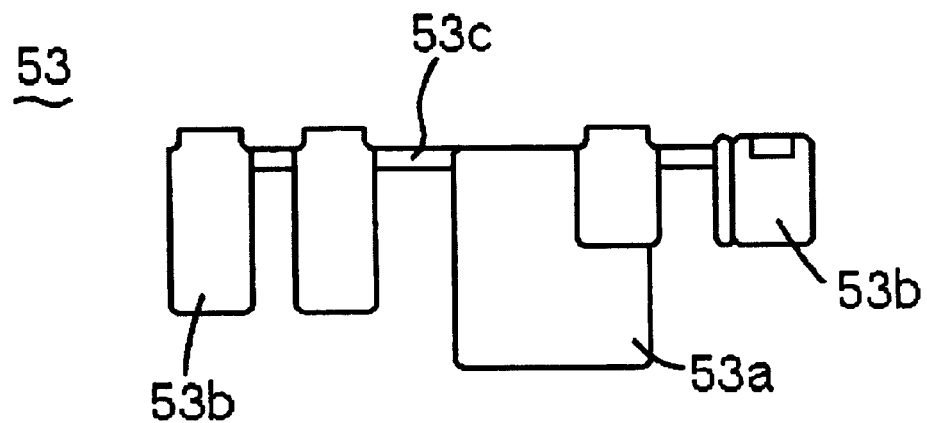
FIGS. 9A and 9B are a side view and a bottom view, respectively, showing a molded unit disposed on the rear surface side of a circuit board in the high-voltage variable resistor.
Figure 9B:
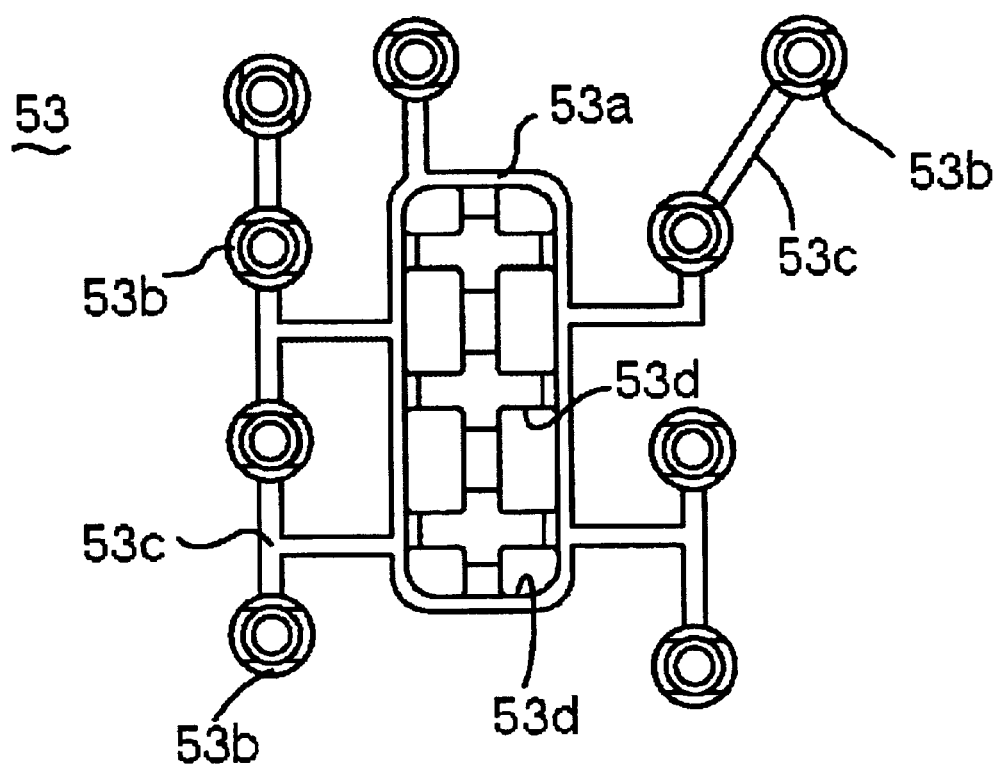

As shown in FIG. 5, the partition wall 6 is formed by being integrally molded with the rear case 3 and by being separated from the rear case 3. If the rear case 3 and the partition wall 6 are molded in different molds, production of all the molds is costly. On the other hand, integral molding involves production of only one mold and thus greatly reduces the costs required for mold production.

As described above, the conductive rubber pieces 9 are used to establish electrical connections between the external connection terminals 8 and the circuit pattern 11 on the circuit board 10. While use of the conductive rubber pieces 9 eases assembly and is preferable, soldering, conductive adhesives, and metal connectors may also be used to establish electrical connections.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A high-voltage variable resistor comprising:
    an insulating-resin front case including:
        a circuit board having a circuit pattern including a resistive element; and
        a slider that is slidable on the resistive element;
    an insulating-resin rear case fitted to the front case including:
        a capacitor housing for accommodating at least one capacitor; and
        a terminal guide for accommodating an external connection terminal, the capacitor housing and the terminal guide being integrally molded with the rear case;
    a contact electrode on the rear surface of the circuit board, the contact electrode being electrically connected to the circuit pattern; and
    a conductive rubber piece, the contact electrode being electrically connected via the conductive rubber piece to the external connection terminal in the terminal guide.

2. The high-voltage variable resistor according to claim 1, wherein the at least one capacitor includes a plurality of capacitors, each of the plurality of capacitors is provided with a lead terminal, the capacitor housing contains the plurality of capacitors provided with the lead terminal, and the capacitor housing is sealed with resin.

3. The high-voltage variable resistor according to claim 2, further comprising an insulating-resin partition wall provided in the capacitor housing for electrically isolating the lead terminals of the plurality of capacitors.

4. The high-voltage variable resistor according to claim 3, wherein the partition wail is a plate disposed on a grooved holder provided in the capacitor housing, and the upper portion of the partition wall protrudes above the lead terminals and toward the rear surface of the circuit board.

5. The high-voltage variable resistor according to claim 3, wherein the partition wall is integrally molded with the rear case and then separated from the rear case.

6. The high-voltage variable resistor according to claim 1, wherein a plurality of the sliders are arranged on the resistive element for varying the resistance of the resistive element.

7. The high-voltage variable resistor according to claim 1, wherein the circuit pattern on the circuit board includes resistive elements for adjusting focus voltages and resistive elements for adjusting screen voltages.

8. The high-voltage variable resistor according to claim 1, wherein resin is provided in only the capacitor housing in the rear case.

9. A high-voltage variable resistor comprising:
an insulating-resin front case including:
a circuit board having a circuit pattern including a resistive element; and
a slider that is slidable on the resistive element; and
an insulating-resin rear case fitted to the front case including:
a capacitor housing for accommodating at least one capacitor; and
a terminal guide for accommodating an external connection terminal, the capacitor housing and the terminal guide being integrally molded with the rear case; wherein
the rear case has a plurality of rubber holders for holding a plurality of conductive rubber pieces therein; and
the front case includes a plurality of contact electrodes on the rear surface of the circuit board, the rear case includes a plurality of external connection terminals, and the plurality of conductive rubber pieces electrically connect each of the plurality of contact electrodes to a respective one of the plurality of external connection terminals.

10. The high-voltage variable resistor according to claim 9, wherein the at least one capacitor includes a plurality of capacitors, each of the plurality of capacitors is provided with a lead terminal, the capacitor housing contains the plurality of capacitors provided with the lead terminal, and the capacitor housing is sealed with resin.

11. The high-voltage variable resistor according to claim 10, further comprising an insulating-resin partition wall provided in the capacitor housing for electrically isolating the lead terminals of the plurality of capacitors.

12. The high-voltage variable resistor according to claim 11, wherein the partition wall is a plate disposed on a grooved holder provided in the capacitor housing, and the upper portion of the partition wall protrudes above the lead terminals and toward the rear surface of the circuit board.

13. The high-voltage variable resistor according to claim 11, wherein the partition wall is integrally molded with the rear case and then separated from the rear case.

14. The high-voltage variable resistor according to claim 9, wherein a plurality of the sliders are arranged on the resistive element for varying the resistance of the resistive element.

15. The high-voltage variable resistor according to claim 9, wherein the circuit pattern on the circuit board includes resistive elements for adjusting focus voltages and resistive elements for adjusting screen voltages.

16. The high-voltage variable resistor according to claim 9, wherein resin is provided in only the capacitor housing in the rear case.

* * * * *